(12) United States Patent
Yang

(10) Patent No.: US 12,101,975 B2
(45) Date of Patent: Sep. 24, 2024

(54) DISPLAY PANEL AND DISPLAY DEVICE

(71) Applicant: Wuhan China Star Optoelectronics Semiconductor Display Technology Co., Ltd., Hubei (CN)

(72) Inventor: Guoqiang Yang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/600,336

(22) PCT Filed: Sep. 14, 2021

(86) PCT No.: PCT/CN2021/118281
§ 371 (c)(1),
(2) Date: Sep. 30, 2021

(87) PCT Pub. No.: WO2023/029090
PCT Pub. Date: Mar. 9, 2023

(65) Prior Publication Data
US 2024/0049529 A1 Feb. 8, 2024

(30) Foreign Application Priority Data
Sep. 6, 2021 (CN) .......................... 202111036522.3

(51) Int. Cl.
*H10K 59/131* (2023.01)
(52) U.S. Cl.
CPC .................................. *H10K 59/131* (2023.02)

(58) Field of Classification Search
None
See application file for complete search history.

(56) References Cited

U.S. PATENT DOCUMENTS

| 2016/0217744 | A1 | 7/2016 | Song et al. |
| 2017/0117343 | A1 | 4/2017 | Oh et al. |
| 2020/0127141 | A1 | 4/2020 | Zhang |
| 2024/0049529 | A1* | 2/2024 | Yang .................... H10K 59/131 |

FOREIGN PATENT DOCUMENTS

| CN | 106611775 | 5/2017 |
| CN | 109216417 | 1/2019 |
| CN | 109300917 | 2/2019 |
| CN | 111293126 | 6/2020 |
| CN | 111341814 | 6/2020 |
| CN | 112786670 | 5/2021 |
| CN | 112802883 | 5/2021 |
| CN | 112863426 | 5/2021 |
| CN | 112909085 | 6/2021 |
| CN | 112951854 | 6/2021 |

(Continued)

*Primary Examiner* — Jack S Chen

(57) ABSTRACT

Provided are a display panel and a display device, comprising a substrate. A driving array on the substrate comprises a first active layer, a second active layer and a first metal layer stacked on the first active layer. An active pattern and a gate of the first transistor are respectively included in the first active layer and the first metal layer. An active pattern of the second transistor is included in the second active layer. A first shielding portion with a predetermined stable voltage is provided between the active pattern of the first transistor and the substrate.

20 Claims, 8 Drawing Sheets

(56) References Cited

FOREIGN PATENT DOCUMENTS

| | | |
|---|---|---|
| CN | 113053912 | 6/2021 |
| CN | 113193010 | 7/2021 |
| CN | 113299716 | 8/2021 |
| CN | 113327936 | 8/2021 |
| WO | WO 2021/168728 | 9/2021 |

* cited by examiner

DISPLAY PANEL AND DISPLAY DEVICE

RELATED APPLICATIONS

This application is a National Phase of PCT Patent Application No. PCT/CN2021/118281 having International filing date of Sep. 14, 2021, which claims the benefit of priority of Chinese Patent Application No. 202111036522.3 filed on Sep. 6, 2021. The contents of the above applications are all incorporated by reference as if fully set forth herein in their entirety.

FIELD AND BACKGROUND OF THE INVENTION

The present application relates to a display technology field, and more particularly to a display panel and a display device.

Compared with low-temperature polysilicon backplanes, low-temperature polycrystalline oxide backplanes are employed in display panels due to their advantages of high charge mobility and good stability. However, some free charges exist in the low-temperature polycrystalline oxide backplane. When the transistor is working, the back gate structure will be formed under the influence of the electric field, which affects the threshold voltage, sub-threshold swing and bias temperature stress of the transistor. Thus, the display effect of the display panel is influenced, causing problems such as image retention appearing on the display panel.

SUMMARY OF THE INVENTION

The embodiments of the present application provide a display panel and a display device, which can improve the influence of free charge on the electrical performance of the transistor.

The embodiment of the present application provides a display panel. The display panel comprises a substrate, a driving array and a shielding layer. The drive array comprises a first active layer and a second active layer on the substrate, a first metal layer on the first active layer and a second metal on the first metal layer. The first active layer comprises a silicon semiconductor material, and the second active layer comprises an oxide semiconductor material. The driving array comprises a plurality of pixel driving circuits, and at least one of the pixel driving circuits comprises a first transistor and a second transistor; wherein the first active layer comprises an active pattern of the first transistor, the second active layer comprises an active pattern of the second transistor, and the first metal layer comprises a gate of the first transistor. The shielding layer comprises a first shielding portion located between the active pattern of the first transistor and the substrate, and the first shielding portion is electrically connected to a predetermined stable voltage through the second metal layer.

In the display panel and the display device provided by the embodiments of the present application, the display panel comprises a substrate, a driving array and a shielding layer. The shielding layer is located between the driving array and the substrate, and the shielding layer is electrically connected to the second metal layer in the driving array to block free charges under the shielding layer with the shielding layer. When the transistors included in the driving array work, the free charge can quickly move and disappear with the back-channel effect under the action of the electric field, thereby improving the influence of the free charge on the electrical performance of the transistor.

BRIEF DESCRIPTION OF THE SEVERAL VIEWS OF THE DRAWINGS

The technical solution and the beneficial effects of the present application are best understood from the following detailed description with reference to the accompanying figures and embodiments.

DESCRIPTION OF SPECIFIC EMBODIMENTS OF THE INVENTION

Figure 1:
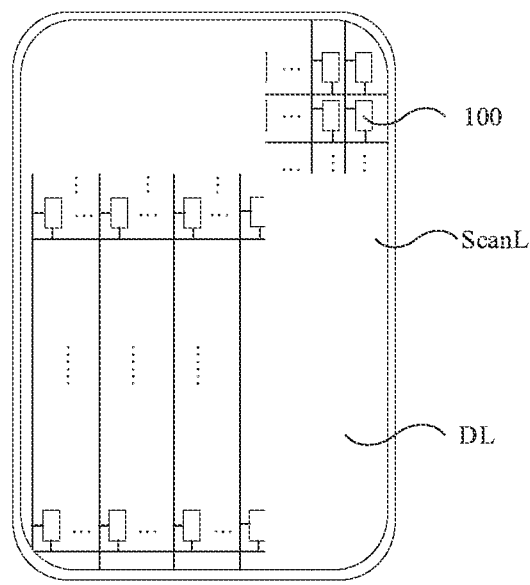
FIG. 1 is a schematic structural diagram of a display panel provided by an embodiment of the present application.

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of skilled in the premise of no creative efforts obtained, should be considered within the scope of protection of the present application. Besides, it should be understood that the specific embodiments described herein are merely for illustrating and explaining the present application and are not intended to limit the present application. In this application, if no explanation is made to the contrary, the orientation words used such as "upper" and "lower" usually refer to the upper and lower of the device in actual use or working state, which specifically are the directions of the drawing in the figures; and "inner" and "outer" refer to the outline of the device.

Specifically, FIG. 1 is a schematic structural diagram of a display panel provided by an embodiment of the present application. Optionally, the display panel provided in the embodiment of the present application may be, but is not limited to, a passive light-emitting display panel, a self-luminous display panel, a quantum dot display panel and the like. Further, the passive light-emitting display panel comprises a liquid crystal display panel, and the self-luminous display panel comprises a display panel with light-emitting devices.

The display panel comprises an active area and a non-display area located at the periphery of the active area. The active area is employed to enable the display panel to realize a display function, and the display panel possesses no display function in the non-display area.

Optionally, the display panel further comprises a sensing area located in at least one of the non-display area, the active area, and a junction of the active area and the non-display area; the sensing area can possess both the display function and the sensing function, or only possess the sensing function. Further, the display panel comprises a sensor disposed in the sensing area. Optionally, the sensor may comprise a camera, a fingerprint sensor, a distance sensor, a sound sensor, an ambient light sensor and the like.

Please continue to refer to FIG. 1, the display panel comprises a plurality of sub-pixels 100, a plurality of data lines DL and a plurality of scan lines ScanL. The plurality of sub-pixels 100 is located in the active area. Each of the sub-pixels 100 is electrically connected to the data line DL and the scan line ScanL corresponding thereto. Optionally, the emitting colors of the plurality of sub-pixels 100 may comprise red, green, blue, white, yellow, etc. The data line DL and the scan line ScanL are arranged to cross each other.

Further, when the display panel is a liquid crystal display panel, each of the sub-pixels 100 enables the deflection of liquid crystal molecules with the electric field formed between the pixel electrode and the common electrode, and the color filter unit cooperates with the liquid crystal molecules to achieve the display of the sub-pixel 100. The pixel electrode is formed on the side of the array substrate and the common electrode is formed on the side of the color filter substrate, or the pixel electrode and the common electrode are formed on the side of the array substrate together; the liquid crystal molecules are located between the array substrate and the color filter substrate; the color filter unit may be formed on the side of the array substrate, or may be formed on the side of the color filter substrate.

Further, when the display panel is a self-luminous display panel, each of the sub-pixels 100 may be formed of a light-emitting device. The light emitting device comprises an organic light emitting diode, a mini light emitting diode or a micro light emitting diode.

Figure 2A:
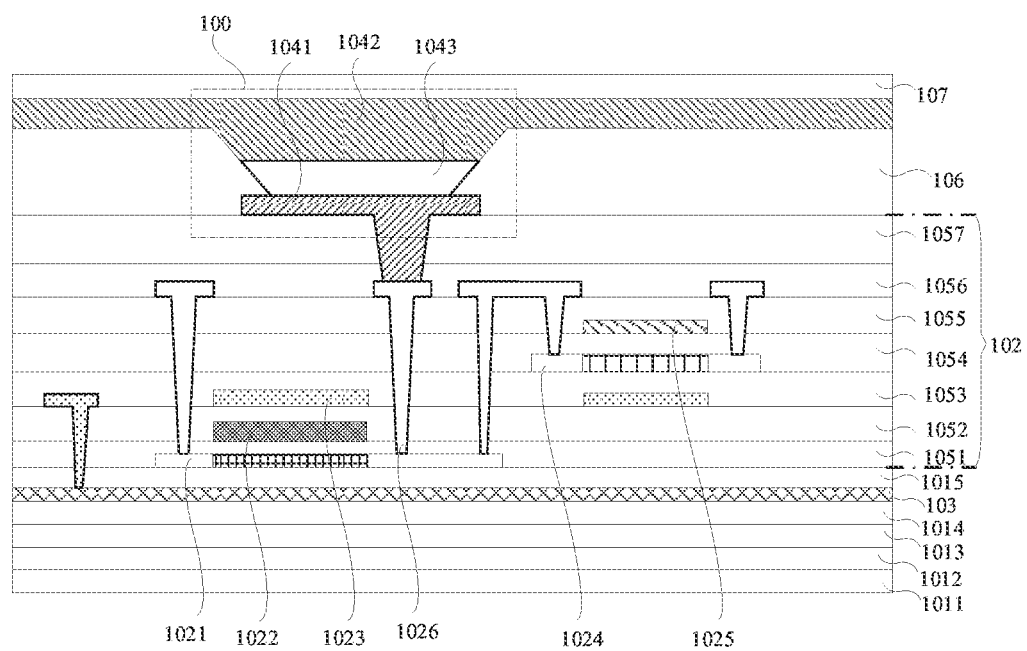
FIG. 2A to FIG. 2B are schematic diagrams of cross-sectional structures of display panels provided by embodiments of the present application.
Figure 2B:
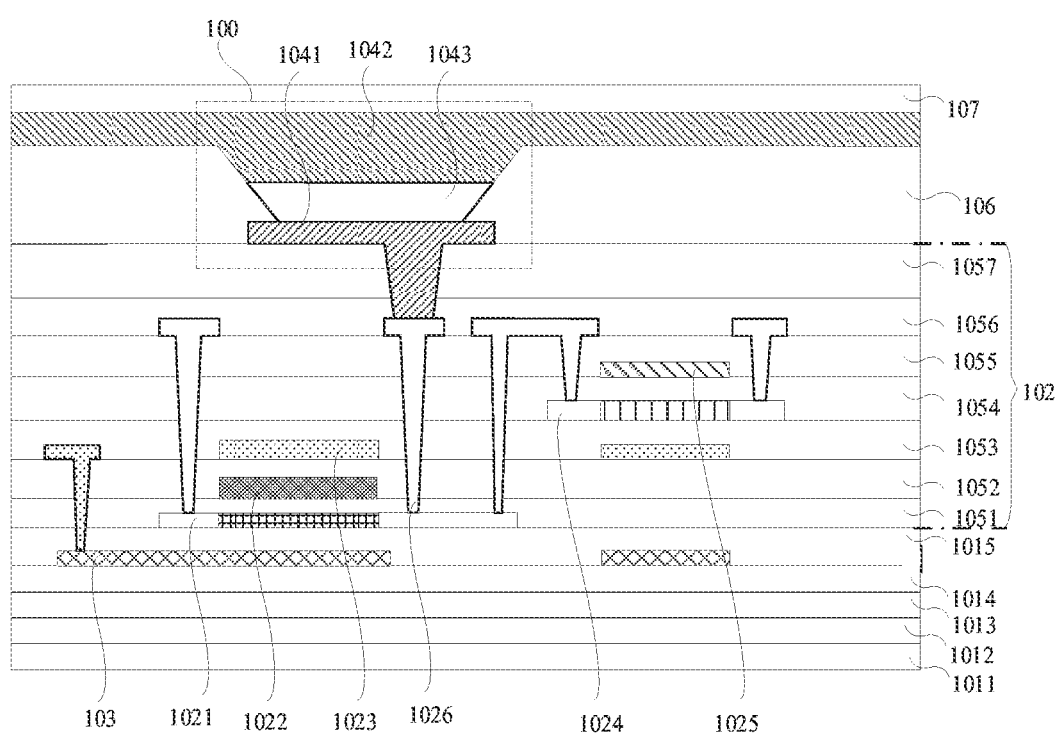
Figure 3:
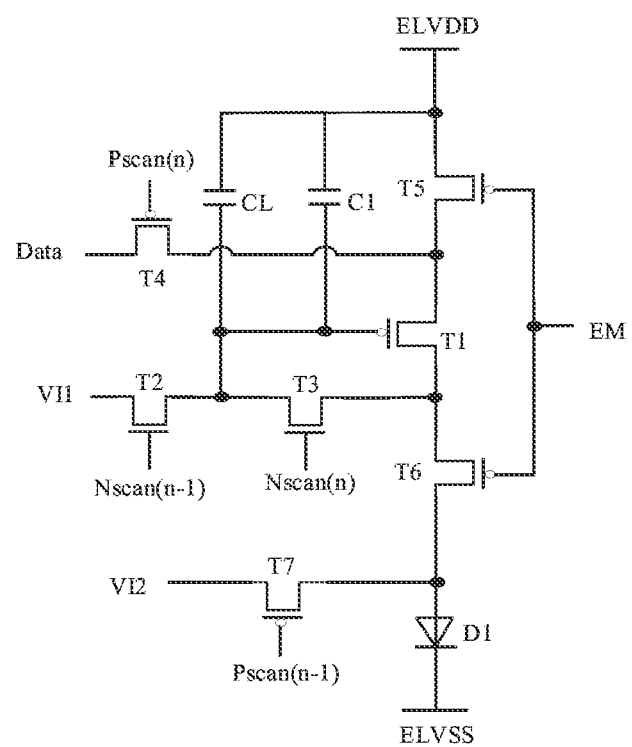
FIG. 3 is a schematic structural diagram of a pixel driving circuit provided by an embodiment of the present application.

FIG. 2A to FIG. 2B are schematic diagrams of cross-sectional structures of display panels provided by embodiments of the present application. FIG. 3 is a schematic structural diagram of a pixel driving circuit provided by an embodiment of the present application. A self-luminous display panel is illustrated as the display panel for describing the structure and working principle of the display panel.

The display panel comprises a substrate 1011, a driving array 102, a shielding layer 103 and a light-emitting device.

The substrate 1011 is a flexible substrate. Specifically, a preparation material of the substrate 1011 comprises polyimide.

The driving array 102 is located on the substrate 1011. The driving array 102 comprises a plurality of the pixel driving circuits, and each of the pixel driving circuits is electrically connected to at least one of the sub-pixel 100 corresponding thereto. Optionally, in the active area, one of the pixel driving circuits is electrically connected to one of the sub-pixels 100, so that the pixel driving circuit drives the sub-pixel 100 to emit light; When the sensing area can achieve the display function of the display panel, one of the pixel driving circuit is electrically connected to a plurality of the sub-pixels 100 located in the sensing area, so as to drive the plurality of sub-pixels 100 to emit light by the pixel driving circuit. The sub-pixel 100 is formed with the light-emitting device. The light-emitting device comprises an anode 1041, a cathode 1042 and a light-emitting layer 1043 located between the anode 1041 and the cathode 1042. Optionally, the light-emitting layer 1043 comprises a fluorescent material, a quantum dot material or a perovskite material.

Please continue to refer to FIG. 2A to FIG. 2B, in the longitudinal cross-sectional view of the display panel, the driving array 102 comprises a first active layer 1021 located on the substrate 1011, a first metal layer 1022 located on the first active layer 1021, a second metal layer 1023 located on the first metal layer 1022, a second active layer 1024 on the second metal layer 1023, a third metal layer 1025 located on the second active layer 1024 and a fourth metal layer 1026 located on the third metal layer 1025.

The first active layer 1021 comprises a silicon semiconductor material, and the second active layer 1024 comprises an oxide semiconductor material. Optionally, the silicon semiconductor material comprises monocrystalline silicon, polycrystalline silicon or amorphous silicon, etc.; the oxide semiconductor material comprises at least one of metal oxides of zinc, indium, gallium, tin or titanium; further, the oxide semiconductor material comprises zinc oxide, zinc tin oxide, zinc indium oxide, indium oxide, titanium oxide, indium gallium zinc oxide or indium zinc tin oxide.

Furthermore, please continue to refer to FIG. 2A to FIG. 2B and FIG. 3, at least one of the pixel driving circuits comprises a first transistor T1 and a second transistor T2. The first active layer 1021 comprises an active pattern of the first transistor T1, the second active layer 1024 comprises an active pattern of the second transistor T2, and the first metal layer 1022 comprises a gate of the first transistor T1. The second metal layer 1023 comprises a metal plate located above the gate of the first transistor T1.

The shielding layer 103 is located between the substrate 1011 and the driving array 102, so that the shielding layer 103 is employed to shield the free charges in the substrate 1011 under the substrate 1011. Accordingly, when the pixel driving circuits work, the free charge can quickly move and disappear with the back-channel effect under the action of the electric field, thereby improving the influence of the free charge on the electrical performances, such as the threshold voltage, sub-threshold swing and bias temperature stress of the transistor T1. Thus, the display effect of the display panel is improved to reduce the probability of problems such as image retention appearing on the display panel.

Optionally, the material for preparing the shielding layer 103 comprises a semiconductor material or a metal material. Furthermore, the preparation material of the shielding layer 103 comprises amorphous silicon or at least one of molybdenum, aluminum, gold and silver.

Optionally, a thickness of the shielding layer 103 is greater than or equal to 15 angstroms and less than or equal to 50 angstroms, to avoid the problem that the thickness of the shielding layer 103 is too thin during the preparation process, the prepared shielding layer 103 cannot be continuously formed into a film, and the film thickness uniformity is poor. Meanwhile, the influence of the over-thick thickness of the shielding layer 103 on the parameters such as the thickness and overall transmittance of the display panel can also be improved. Specifically, the thickness of the shielding layer 103 may be 15 angstroms, 16 angstroms, 19 angstroms, 20 angstroms, 25 angstroms, 28 angstroms, 30 angstroms, 31 angstroms, 35 angstroms, 40 angstroms, 42 angstroms, 45 angstroms, 48 angstroms or 50 angstroms.

Furthermore, please continue to refer to FIG. 2A to FIG. 2B. The display panel further comprises a barrier layer 1012, a second substrate 1013, a first buffer layer 1014 and a second buffer layer 1015 sequentially stacked in a direction from the substrate 1011 toward the driving array 102.

The second substrate 1013 comprises a flexible substrate. Specifically, a preparation material of the second substrate 1013 comprises polyimide.

The second buffer layer 1015 may adopt a single-layer design or a multi-layer laminated structure design. Further, the second buffer layer 1015 adopts a multi-film laminated structure design of silicon nitride, silicon oxide and amorphous silicon.

Optionally, the shielding layer 103 may be located between the substrate 1011 and the barrier layer 1012 to shield the free charge contained in the substrate 1011 under the shielding layer 103, thereby reducing the influence of free charge in the substrate 1011 on the electrical performance of the first transistor T1.

Optionally, the shielding layer 103 may be located between the barrier layer 1012 and the second substrate 1013 to shield the free charge contained in the substrate 1011 and the free charge existing at an interface between the substrate 1011 and the barrier layer 1012 under the shielding layer 103, thereby reducing the influences of free charge in the substrate 1011 and the free charge existing at an interface between the substrate 1011 and the barrier layer 1012 on the electrical performance of the first transistor T1.

Optionally, the shielding layer 103 may be located between the second substrate 1013 and the first buffer layer 1014 to shield the free charge contained in the substrate 1011, the free charge existing at an interface between the substrate 1011 and the barrier layer 1012 and the free charge contained in the second substrate 1013 under the shielding layer 103, thereby reducing the influences of free charge in the substrate 1011, the free charge existing at an interface between the substrate 1011 and the barrier layer 1012 and the free charge contained in the second substrate 1013 on the electrical performance of the first transistor T1.

Optionally, the shielding layer 103 may be located between the first buffer layer 1014 and the second buffer layer 1015. Then, the distance between the shielding layer 103 and the driving array 102 is shorter, capable of reducing the influences of free charge in the substrate 1011, the free charge existing at an interface between the substrate 1011 and the barrier layer 1012 and the free charge contained in the second substrate 1013 on the electrical performance of the first transistor T1 and betterly homogenizing the electric field.

Optionally, the display panel may comprise a plurality of shielding layers 103 between the driving array 102 and the substrate 1011, or may comprise only a single shielding layer 103. As in some embodiments, the display panel comprises at least one of a first shielding layer located between the substrate 1011 and the barrier layer 1012, a second shielding layer located between the barrier layer 1012 and the second substrate 1013, a third shielding layer located between the second substrate 1013 and the first buffer layer 1014 and a fourth shielding layer located between the first buffer layer 1014 and the second buffer layer 1015. Further, the fourth shielding layer adopts a patterned design. Optionally, in a top view angle, the fourth shielding layer is provided corresponding to the first active layer 1021 and the second active layer 1024, so as reduce the influences of free charge in the substrate 1011, the free charge existing at an interface between the substrate 1011 and the barrier layer 1012 and the free charge contained in the second substrate 1013 on the electrical performance of the respective transistors when the transistors included in the pixel driving circuit respectively form conductive channels.

Optionally, the shielding layer 103 is electrically connected to the first metal layer 1022, the second metal layer 1023, the third metal layer 1025, the anode 1041 or the cathode 1042, so that the shielding layer 103 possesses a stable potential. Thus, when the pixel driving circuit works, the adsorption amount of the free charge by the gate voltage of the first transistor T1 is further reduced, thereby improving the influence of the free charge on the electrical performance of the first transistor T1.

Further, as shown in FIG. 3, the second metal layer 1023 comprises a first signal line VI1, and the shielding layer 103 is electrically connected to the first signal line VI1, so that the shielding layer 103 may possesses different potentials according to different requirements through the first signal line VI1. Compared with the design in which the shielding layer 103 is electrically connected to the first metal layer 1022, the third metal layer 1025, the anode 1041 or the cathode 1042, the design in which the shielding layer 103 is electrically connected to the first signal line VI1 is less difficult to adjust the electrical characteristics of the respective transistors in the pixel driving circuit because the shielding layer 103 may possesses different potentials according to different requirements through the first signal line VI1.

Please continue to refer to FIG. 3. The gate of the first transistor T1 is electrically connected to the first signal line VI1, and the gate of the first transistor T1 is reset by the first signal transmitted through the first signal line VI1.

Further, the second transistor T2 is electrically connected between the gate of the first transistor T1 and the first signal line VI1, and the second transistor T2 is employed to transmit the first signal to the gate of the first transistor T1. Specifically, please continue to refer to FIG. 2A to FIG. 2B and FIG. 3. The second metal layer 1023 further comprises a bottom gate of the second transistor T2, and the second active layer is located on the second metal layer 1023, and the active pattern of the second transistor T2 is located above the bottom gate of the second transistor T2; the third metal layer 1025 comprises a top gate of the second transistor T2; the fourth metal layer 1026 comprises a source and a drain of the first transistor T1, and the source and drain of the first transistor T1 are electrically connected to the active pattern of the first transistor T1; the fourth metal layer 1026 further comprises a source and a drain of the second transistor T2, and the source and drain of the second transistor T2 are electrically connected to the active pattern of the second transistor T2; one of the source and drain of the second transistor T2 is electrically connected to the first signal line VI1, and the other of the source and drain of the second transistor T2 is connected to the gate of the first transistor T1.

Please continue to refer to FIG. 2A to FIG. 2B and FIG. 3, at least one of the pixel driving circuits further comprises a third transistor T3 electrically connected between the gate of the first transistor T1 and one of the source and drain of the first transistor T1. The third transistor T3 is employed to transmit a data signal with function of compensating the threshold voltage of the first transistor T1 to the gate of the first transistor T1. Specifically, the second active layer 1024 further comprises an active pattern of the third transistor T3; the second metal layer 1023 further comprises a bottom gate of the third transistor T3, and the active pattern of the third transistor T3 is located above the bottom gate of the third transistor T3; the third metal layer 1025 further comprises a top gate of the third transistor T3, the fourth metal layer 1026 further comprises a source and a drain of the third transistor T3, and the source and the drain of the third transistor T3 are electrically connected to the active pattern of the third transistor T3. One of the source and the drain of the third transistor T3 is electrically connected to the gate of the first transistor T1, and the other of the source and the drain of the third transistor T3 is electrically connected to one of the source and the drain of the first transistor T1.

Please continue to refer to FIG. 2A to FIG. 2B and FIG. 3, at least one of the pixel driving circuits further comprises a fourth transistor T4, a fifth transistor T5, a sixth transistor T6, a seventh transistor T7 and the first capacitor C1. The second metal layer 1023 further comprises a second signal line VI2; the third metal layer 1025 comprises a third signal line Nscan(n−1) and a fourth signal line Nscan(n); the fourth metal layer 1026 further comprises a fifth signal line Data and a ninth signal line ELVDD. The first metal layer 1022 further comprises a sixth signal line Pscan(n−1), a seventh signal line Pscan(n) and an eighth signal line EM. The scan signal line ScanL comprises the third signal line Nscan(n−1), the fourth signal line Nscan(n), the sixth signal line Pscan(n−1) and the seventh signal line Pscan(n); the data line DL comprises the fifth signal line Data.

The fourth transistor T4 is electrically connected between the fifth signal line Data and one of the source and the drain of the first transistor T1. The fourth transistor T4 is employed to transmit the data signal transmitted by the fifth signal line Data to one of the source and the drain of the first transistor T1. Specifically, the first active layer 1021 further comprises the active pattern of the fourth transistor T4. The first metal layer 1022 further comprises the gate of the fourth transistor T4. The fourth metal layer 1026 further comprises the source and the drain of the fourth transistor T4, and the source and the drain of the fourth transistor T4 are electrically connected to the active pattern of the fourth transistor T4. One of the source and the drain of the fourth transistor T4 is electrically connected to the fifth signal line Data, and the other of the source and the drain of the fourth transistor T4 is electrically connected to one of the source and the drain of the first transistor T1. The gate of the fourth transistor T4 is electrically connected to the seventh signal line Pscan(n).

The fifth transistor T5 is electrically connected between the ninth signal line ELVDD and one of the source and the drain of the first transistor T1. The sixth transistor T6 is electrically connected between the other of the source and drain of the first transistor T1 and the light-emitting device. The fifth transistor T5 and the sixth transistor T6 are employed for controlling the first transistor T1 to generate a driving current for driving the light-emitting device to emit light according to the light emission control signal loaded by the eighth signal line EM. Specifically, the first active layer 1021 further comprises an active pattern of the fifth transistor T5 and an active pattern of the sixth transistor T6. The first metal layer 1022 further comprises a gate of the fifth transistor T5 and a gate of the sixth transistor T6. The fourth metal layer 1026 further comprises a source and a drain of the fifth transistor T5 and a source and a drain of the sixth transistor T6. The source and the drain of the fifth transistor T5 are electrically connected to the active pattern of the fifth transistor T5. The source and the drain of the sixth transistor T6 are electrically connected to the active pattern of the sixth transistor T6. One of the source and the drain of the fifth transistor T5 is electrically connected to the gate of the ninth signal line ELVDD, and the other of the source and the drain of the fifth transistor T5 is electrically connected to one of the source and the drain of the first transistor T1. One of the source and the drain of the sixth transistor T6 is electrically connected to the anode 1041 of the light-emitting device, and the other of the source and the drain of the sixth transistor T6 is electrically connected to the other of the source and the drain of the first transistor T1; the gate of the fifth transistor T5 and the gate of the sixth transistor T6 are electrically connected to the eighth signal line EM.

The seventh transistor T7 is electrically connected between the second signal line VI2 and the anode 1041 of the light-emitting device. The seventh transistor T7 is employed to transmit the second signal transmitted by the second signal line VI2 to the anode 1041 of the light-emitting device, so as to reset an anode voltage of the light-emitting device. Specifically, the first active layer 1021 further comprises an active pattern of the seventh transistor T7. The first metal layer 1022 further comprises a gate of the seventh transistor T7. The fourth metal layer 1026 further comprises a source and a drain of the seventh transistor T7, and the source and the drain of the seventh transistor T7 are electrically connected to the active pattern of the seventh transistor T7. One of the source and the drain of the seventh transistor T7 is electrically connected to the second signal line VI2. The other of the source and the drain of the seventh transistor T7 is electrically connected to the anode 1041 of the light-emitting device. The gate of the seventh transistor T7 is electrically connected to the sixth signal line Pscan (n−1).

The first capacitor C1 is connected in series between the gate of the first transistor T1 and the ninth signal line ELVDD. The pixel driving circuit further comprises: a storage capacitor. The storage capacitor comprises a first capacitor electrode and a second capacitor electrode. The first metal layer 1022 comprises the first capacitor electrode electrically connected to the gate of the first transistor T1, and the second metal layer 1023 comprises the second capacitor electrode disposed opposite to the first capacitor electrode. The first capacitor C1 can be the storage capacitor. Further, the gate of the first transistor T1 and the metal plate located above the gate of the first transistor T1 in the second metal layer 1023 respectively form a lower electrode plate and an upper electrode plate of the first capacitor C1. The lower electrode plate of the first capacitor C1 may be configured as the first capacitor electrode, and the upper electrode plate of the first capacitor C1 may be configured as the second capacitor electrode.

The third signal line Nscan(n−1) is electrically connected to the gate of the second transistor T2; the fourth signal line Nscan(n) is electrically connected to the gate of the third transistor T3.

Optionally, the second transistor T2 and the third transistor T3 are N-type transistors, and the first transistor T1 and the fourth transistor T4 to the seventh transistor T7 are P-type transistors. Optionally, the first transistor T1 to the seventh transistor T7 comprise field effect transistors; further, the second transistor T2 and the third transistor T3 are metal oxide semiconductor field effect transistor, and the first transistor T1 and the fourth transistor T4 to the seventh transistor T7 are thin film transistors.

Optionally, the first signal transmitted by the first signal line VI1 may be a direct current signal or an alternating current signal, and the second signal transmitted by the second signal line VI2 is a direct current signal. Further, the first signal is a direct current signal that can be positive or negative, and the first signal can be greater or less than the second signal, and can also be equal to the second signal. Further, the first signal is an alternating current signal; specifically, when the second transistor T2 is turned on, the first signal is equal to the second signal; when the second transistor T2 is turned off, the first signal is equal to the signal transmitted on the ninth signal line ELVDD.

It can be understood that, in practical applications, the structure of each pixel driving circuit is not limited to the structure of 7T1C as shown in FIG. 3, and may also be in the form of 7T2C or the like.

Optionally, the shielding layer 103 may be an entire surface design, or a patterned design.

Here, the shielding layer 103 adopts the patterned design. Specifically, please refer to FIG. 4A to FIG. 4D, the display panel adopting the pixel driving circuit shown in FIG. 3 is illustrated, the patterned design of the shielding layer 103 will be described.

Please continue to refer to FIG. 2B, FIG. 3, FIG. 4A to FIG. 4D. The shielding layer 103 comprises a first shielding portion 1031 located between the active pattern of the first transistor T1 and the substrate 1011, and the first shielding portion 1031 is electrically connected to a predetermined stable voltage through the second metal layer 1023. Specifically, the first shielding portion 1031 is electrically connected to the second metal layer 1023 to possess the predetermined stable voltage.

Specifically, the driving array further comprises a first insulating layer 1051 located on the first active layer 1021 and the second buffer layer 1015, a second insulating layer 1052 located on the first insulating layer 1051 and the first metal layer 1022, a first dielectric layer 1053 located on the second metal layer 1023 and the second insulating layer 1052, a third insulating layer 1054 located on the first dielectric layer 1053 and the second active layer 1024, a second dielectric layer 1055 located on the third insulating layer 1054 and the third metal layer 1025, a protective layer 1056 on the fourth metal layer 1026 and the second dielectric layer 1055 and a planarization layer 1057 located on the protective layer 1056. Specifically, the second metal layer 1023 may possess a predetermined stable voltage. The first shielding portion 1031 is located between the first buffer layer 1014 and the second buffer layer 1015. The first shielding portion 1031 is electrically connected to the second metal layer 1023 through a first via hole 100a penetrating the second buffer layer 1015, the first insulating layer 1051 and the second insulating layer 1052. Namely, the potential of the first shielding portion 1031 may be the same as the potential of the second metal layer 1023, and both are equal to the predetermined stable voltage.

Optionally, in a top view angle, the orthographic projection of the first transistor T1 on the substrate 1011 is located within the orthographic projection of the first shielding portion 1031 on the substrate 1011. Furthermore, in a top view angle, the orthographic projection of the first transistor T1 on the substrate 1011 is located within the orthographic projection of the first shielding portion 1031 on the substrate 1011 to employ the first shielding portion 1031 to shield the free charge under the first shielding portion 1031 to reduce the influence of the free charge on the electrical performance of the first transistor T1.

Furthermore, the first shielding portion 1031 is electrically connected to the first signal line Vl1.

Specifically, the first shielding portion 1031 is disposed opposite to the first capacitor electrode. It is understandable that on the basis that the first capacitor electrode and the second capacitor electrode are disposed opposite to each other to form the storage capacitor, that the first shielding portion 1031 and the first capacitor electrode are disposed opposite to each other can form an auxiliary capacitor in parallel with the storage capacitor. Similarly, when the storage capacitor is the first capacitor C1, that is, when the first capacitor electrode is the gate of the first transistor T1, the first shielding portion 1031 corresponds to the active pattern of the first transistor T1 and the gate of the first transistor T1 also corresponds to the active pattern of the first transistor T1, thus the first shielding portion 1031 and the gate of the first transistor T1 can form a second capacitor CL as the auxiliary capacitor. Furthermore, when the second transistor T2 is turned on, the first signal is equal to the second signal; when the second transistor T2 is turned off, the first signal is equal to the signal transmitted on the ninth signal line ELVDD. The first shielding portion 1031 is electrically connected to the first signal line Vl1, then when the second transistor T2 is turned on, the second capacitor CL is short-circuited due to the equal potential at both ends, and the first signal resets the gate of the first transistor T1; when the second transistor T2 is turned off, the second capacitor CL is connected in parallel with the first capacitor C1, which increases the capacitance in the pixel driving circuit, to be more conducive to sufficient writing of the data signal loaded on the fifth signal line Data.

Figure 4A:
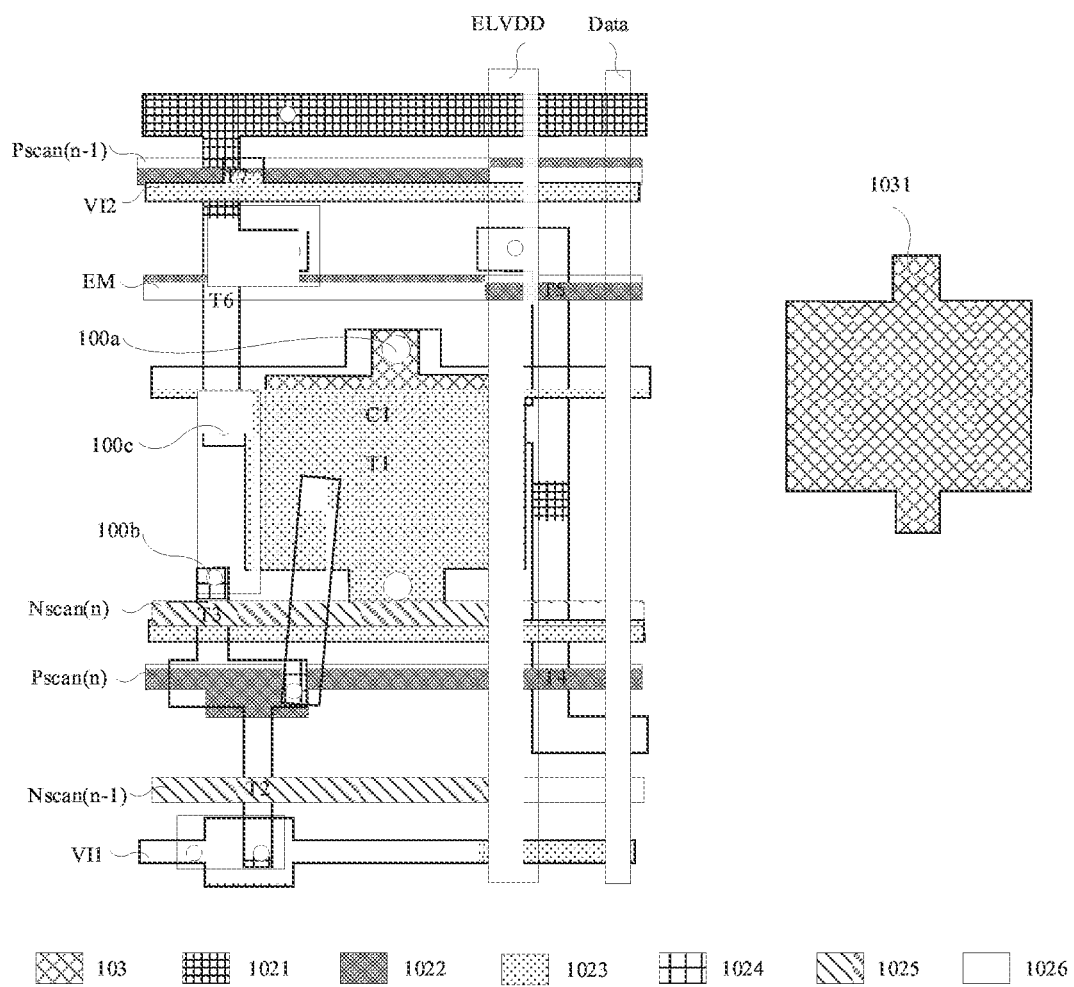
FIGS. 4A, 4B, 4C and FIG. 4D are schematic diagrams of a top view structure of a display panel adopting the pixel driving circuit shown in FIG. 3.
Figure 4B:
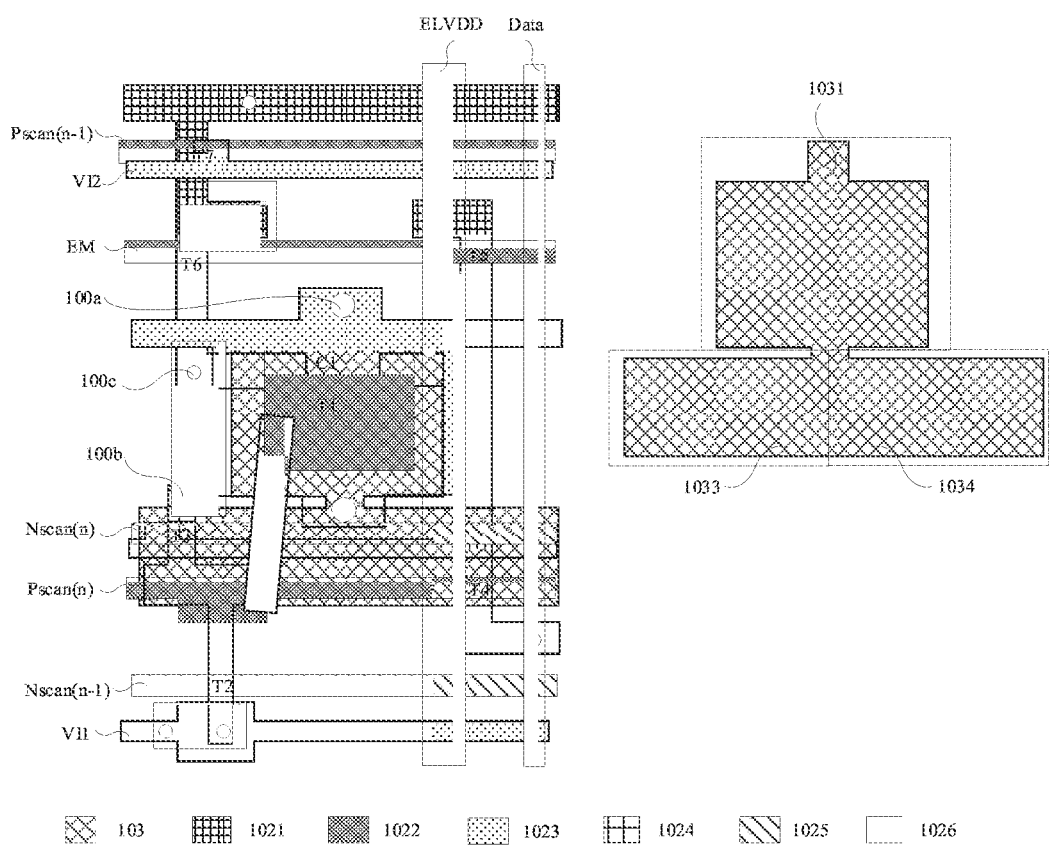
Figure 4C:
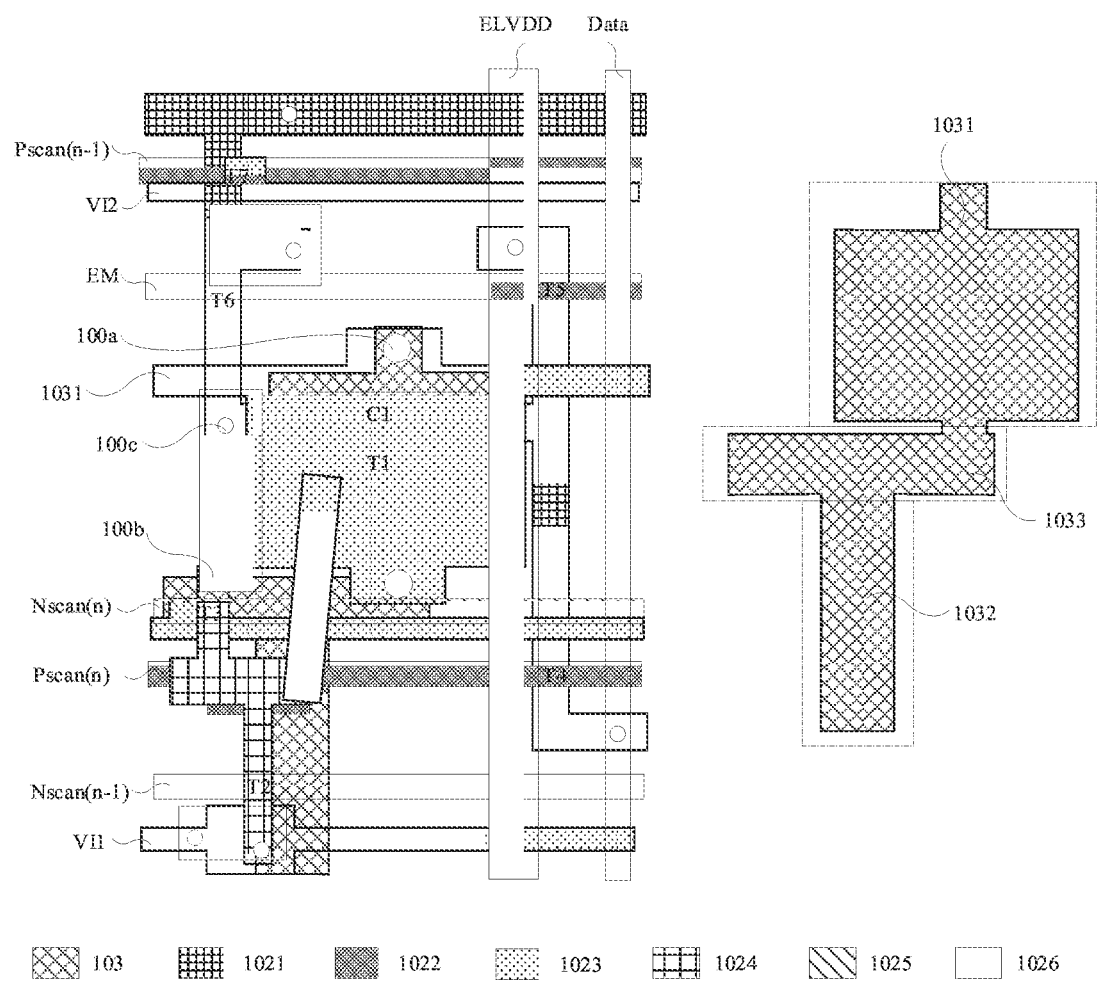
Figure 4D:
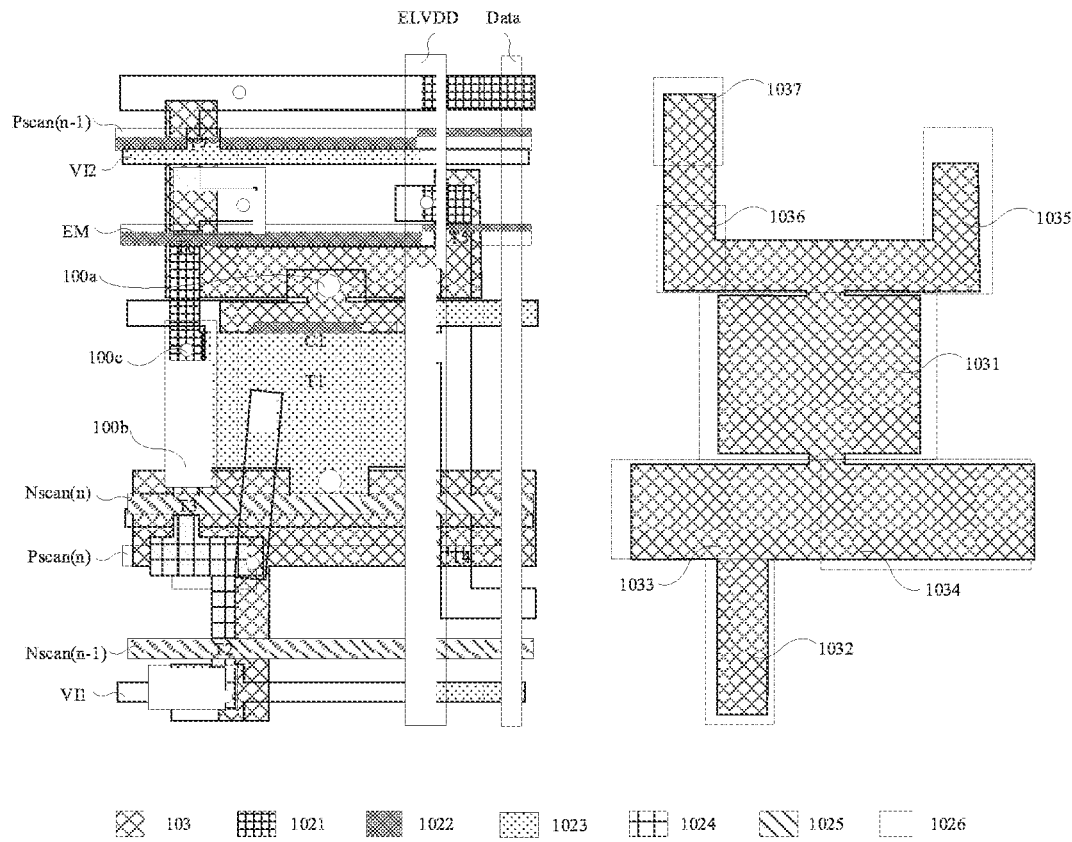

Furthermore, please continue to refer to FIG. 4C to FIG. 4D. The shielding layer 103 further comprises a second shielding line 1032, and the second shielding line 1032 is located between the active pattern of the second transistor T2 and the substrate 1011, and the second shielding line 1032 is electrically connected to the first shielding portion 1031.

Since the first signal transmitted by the first signal line Vl1 may be different from the second signal transmitted by the second signal line Vl2, in a top view, the first signal line Vl1 and the second signal line Vl2 are spaced apart. Besides, since in a top view, the first signal line Vl1 is close to the second shielding line 1032, the first shielding portion 1031 can be electrically connected to the first signal line Vl1 through the second shielding line 1032.

Further, the shielding layer 103 further comprises a third shielding line 1033, and the third shielding line 1033 is located between the active pattern of the third transistor T3 and the substrate 1011. The third shielding line 1033 is electrically connected to the second shielding line 1032 and the first shielding portion 1031. Namely, the first shielding portion 1031 can be electrically connected to the first signal line Vl1 through the third shielding line 1033 and the second shielding line 1032.

Further, the shielding layer 103 further comprises a fourth shielding line 1034 located between the active pattern of the fourth transistor T4 and the substrate 1011, as shown in FIG. 4B and FIG. 4D; the shielding layer 103 further comprises a fifth shielding line 1035 located between the active pattern of the fifth transistor T5 and the substrate 1011, a sixth shielding line 1036 located between the active pattern of the sixth transistor T6 and the substrate 1011 and a seventh shield line 1037 located between the active pattern of the seventh transistor T7 and the substrate 1011, as shown in FIG. 4D.

Optionally, the fourth shielding line 1034, the fifth shielding line 1035, the sixth shielding line 1036 and the seventh shielding line 1037 are spaced apart or in contact with each other. The fourth shielding line 1034, the fifth shielding line 1035, the sixth shielding line 1036 or the seventh shielding line 1037 may be electrically connected to the second metal layer 1023, or may not be electrically connected to the second metal layer 1023.

Optionally, the first shielding line 1031, the second shielding line 1032, the third shielding line 1033, the fourth shielding line 1034, the fifth shielding line 1035, the sixth shielding line 1036 and the seventh shielding line 1037 may be disposed in the same layer, or may be located in different layers, respectively.

Optionally, in a top view angle, the orthographic projection of the second transistor T2 on the substrate 1011 is within the orthographic projection of the second shielding line 1032 on the substrate 1011; the orthographic projection of the third transistor T3 on the substrate 1011 is within the orthographic projection of the third shielding line 1033 on the substrate 1011; the orthographic projection of the fourth transistor T4 on the substrate 1011 is within the orthographic projection of the fourth shielding line 1034 on the substrate 1011; the orthographic projection of the fifth transistor T5 on the substrate 1011 is within the orthographic projection of the fifth shielding line 1035 on the substrate 1011; the orthographic projection of the sixth transistor T6 on the substrate 1011 is within the orthographic projection of the sixth shielding line 1036 on the substrate 1011; the orthographic projection of the seventh transistor T7 on the substrate 1011 is located within the orthographic projection of the seventh shielding line 1037 on the substrate 1011, to reduce the influence of free charge on the electrical performance of the second transistor T2 to the seventh transistor T7.

Although the entire surface design of the shielding layer 103 can save the preparation of the mask and the production capacity, but more materials are used, the effect of the realized electric field is poor and crosstalk is easily generated. Although the patterned design of the shielding layer 103 will increase the manufacturing process and production capacity, the effect of equalizing the electric field is better, and it is not conducive to the formation of parasitic capacitance, which can reduce the probability of crosstalk problems and reduce the amount of materials.

The source and the drain of the second transistor T2 are electrically connected to the active pattern of the second transistor T2 through a second via hole 100b penetrating the third insulating layer 1054 and the second dielectric layer 1055; similarly, the source and the drain of the third transistor T3 are electrically connected to the active pattern of the third transistor T3 through the second via hole 100b. The source and the drain of the fourth transistor T4 are electrically connected to the active pattern of the fourth transistor T4 through a third via hole 100c penetrating the first insulating layer 1051, the second insulating layer 1052, the first dielectric layer 1053, the third insulating layer 1054 and the second dielectric layer 1055. Similarly, the source and the drain of the fifth transistor T5 are electrically connected to the active pattern of the fifth transistor T5 through the third via hole 100c, and the source and the drain of the sixth transistor T6 are electrically connected to the active pattern of the sixth transistor T6 through the third via 100c. The source and the drain of the seventh transistor T7 are electrically connected to the active pattern of the seventh transistor T7 through the third via 100c.

Please continue to refer to FIG. 2A to FIG. 2B, the display panel further comprises a pixel definition layer 106 and an encapsulation layer 107. The light-emitting layer 1043 is located in the pixel defining area of the pixel defining layer 106, and the encapsulation layer 107 is located on the light-emitting device. It can be understood that the display panel further comprises a polarizer, touch electrodes and other parts not shown.

Figure 5A:
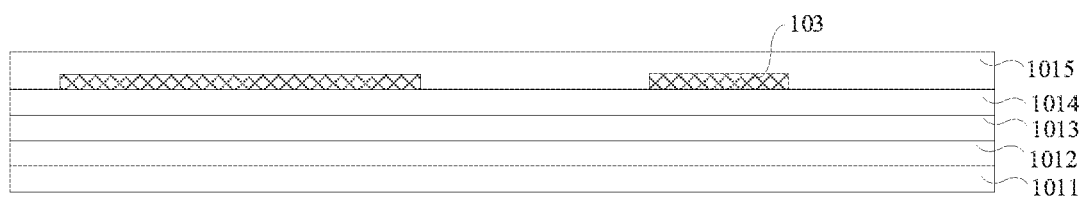
FIGS. 5A, 5B and FIG. 5C are schematic diagrams of a manufacturing process of the display panel provided by an embodiment of the present application.
Figure 5B:
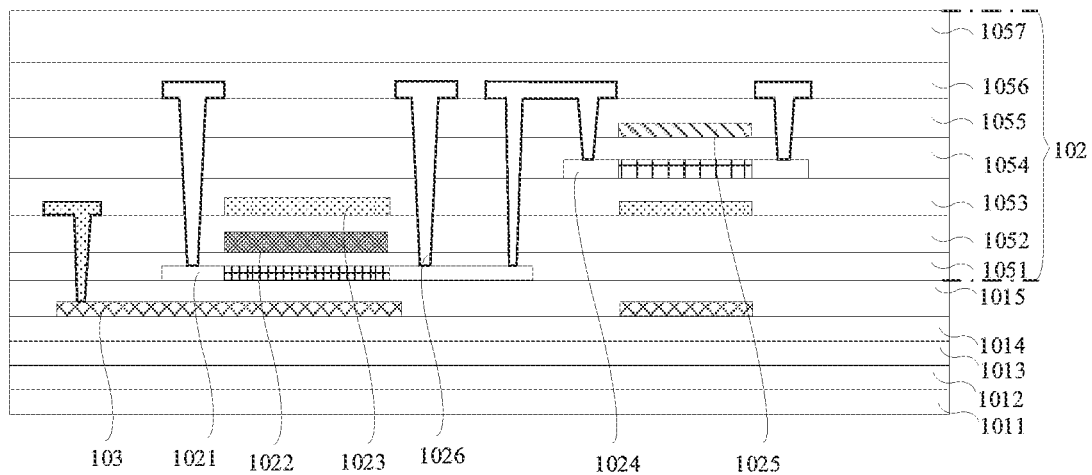
Figure 5C:
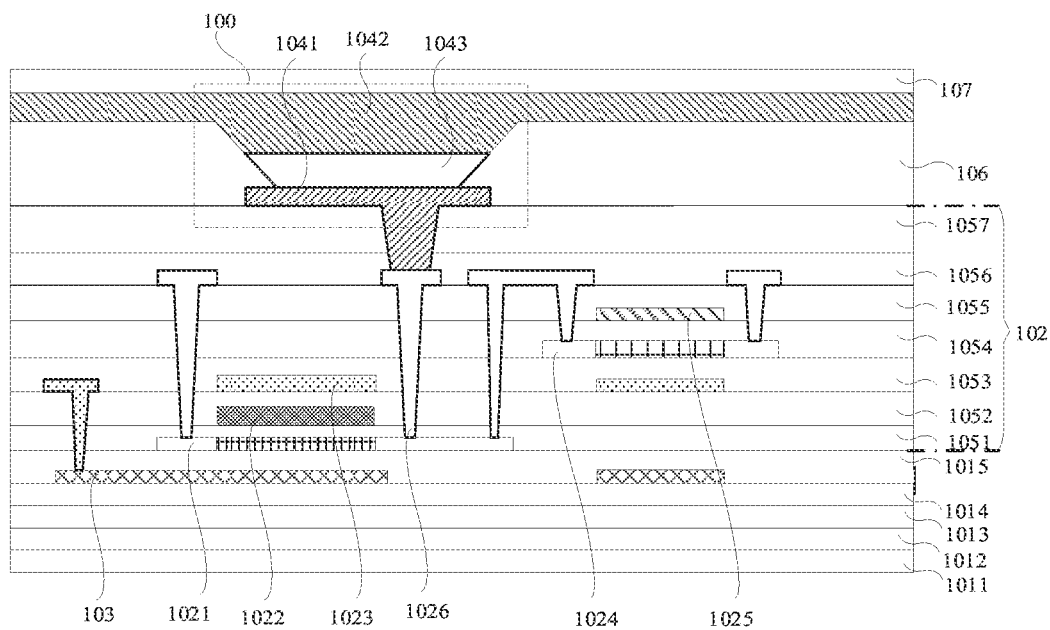

FIG. 5A to FIG. 5C are schematic diagrams of a manufacturing method of the display panel provided by an embodiment of the present application. The embodiment of the present application further provides a manufacturing method of a display panel for manufacturing any of the aforesaid panels. Specifically, the manufacturing method comprises steps of:

Step S10: providing the substrate 1011;
Step S20: preparing the shielding layer 103 on the substrate 1011, as shown in FIG. 5A;
Step S30: preparing the driving array 102 on the shielding layer 103, as shown in FIG. 5B.

Further, after Step S30, the manufacturing method further comprises: preparing the sub-pixel 100 and the encapsulation layer 107 on the driving array 102, as shown in FIG. 5C. Specifically, the anode 1041, the pixel defining layer 106, the light-emitting layer 1043, and the cathode 1042 are sequentially prepared on the driving array 102. The encapsulation layer 107 is located on the cathode 1042, and the light-emitting layer 1043 is located in the pixel defining area of the pixel defining layer 106.

Step S10 further comprises: sequentially preparing the barrier layer 1012, the second substrate 1013 and the first buffer layer 1014 on the substrate 1011, and the shielding layer 103 is located on the first buffer layer 1014. Step S20 further comprises: preparing the second buffer layer 1015 on the shielding layer 103.

Furthermore, Step S20 further comprises patterning the shielding layer 103.

Step S30 further comprises: sequentially preparing the first active layer 1021, the first insulating layer 1051, the patterned first metal layer 1022, the second insulating layer 1052, the patterned second metal layer 1023, the first dielectric layer 1053, the second active layer 1024, the third insulating layer 1054, the patterned third metal layer 1025, the second dielectric layer 1055, the patterned fourth metal layer 1026, the protective layer 1056 and the planarization layer 1057 on the second buffer layer 1015. The shielding layer 103 is electrically connected to the second metal layer 1023 through a first via hole penetrating the second buffer layer 1015, the first insulating layer 1051 and the second insulating layer 1052.

The embodiment of the present application further provides a display device, comprising any one of the aforesaid display panels.

The display devices comprise fixed terminals (such as TVs, desktop computers, etc.), mobile terminals (such as mobile phones, notebooks, etc.), and wearable devices (such as bracelets, virtual display devices, enhanced display devices, etc.).

The embodiments of the present application are described in detail as aforementioned, and the principles and implementations of the present application have been described with reference to specific illustrations. The description of the foregoing embodiments is merely for helping to understand the technical solutions of the present application and the core ideas thereof; meanwhile, those skilled in the art will be able to change the specific embodiments and the scope of the application according to the idea of the present application. In conclusion, the content of the specification should not be construed as limiting the present application.

What is claimed is:
1. A display panel, comprising:
a substrate;
a driving array, comprising a first active layer and a second active layer on the substrate, a first metal layer located on the first active layer and a second metal layer located on the first metal layer, and the first active layer comprises a silicon semiconductor material, and the second active layer comprises an oxide semiconductor material;
the driving array comprises a plurality of pixel driving circuits, and at least one of the pixel driving circuits comprises a first transistor and a second transistor; wherein the first active layer comprises an active pattern of the first transistor, the second active layer comprises an active pattern of the second transistor, and the first metal layer comprises a gate of the first transistor; and a shielding layer, comprising a first shielding portion located between the active pattern of the first transistor and the substrate, and the first shielding portion is electrically connected to a predetermined stable voltage through the second metal layer;

wherein the pixel driving circuit further comprises:

a storage capacitor, comprising a first capacitor electrode and a second capacitor electrode, and the first metal layer comprises the first capacitor electrode electrically connected to the gate of the first transistor, and the second metal layer comprises the second capacitor electrode disposed opposite to the first capacitor electrode;

wherein the second metal layer further comprises a first signal line electrically connected to the gate of the first transistor, and the first shielding portion is electrically connected to the first signal line.

2. The display panel according to claim 1, wherein the first shielding portion is disposed opposite to the first capacitor electrode.

3. The display panel according to claim 1, further comprising a light-emitting device electrically connected to one of a source and a drain of the first transistor, and the second metal layer further comprises a second signal line, and at least one of the pixel driving circuits further comprises a seventh transistor, and the second signal line is electrically connected to the light-emitting device through the seventh transistor, and the first signal line and the second signal line are spaced apart.

4. The display panel according to claim 3, wherein the second metal layer further comprises a bottom gate of the second transistor, and the second active layer is located on the second metal layer, and the active pattern of the second transistor is located above the bottom gate of the second transistor.

5. The display panel according to claim 4, wherein the second transistor is electrically connected between the gate of the first transistor and the first signal line; the shielding layer further comprises a second shielding line, and the second shielding line is located between the active pattern of the second transistor and the substrate, and the second shielding line is electrically connected to the first shielding portion.

6. The display panel according to claim 5, wherein at least one of the pixel driving circuits further comprises a third transistor electrically connected between the gate of the first transistor and one of the source and drain of the first transistor, and the second active layer comprises an active pattern of the third transistor;

the shielding layer further comprises a third shielding line, and the third shield line is located between the active pattern of the third transistor and the substrate, and is electrically connected to the first shielding portion and the second shielding line.

7. A display panel, comprising:

a substrate;

a driving array, comprising a first active layer and a second active layer on the substrate, a first metal layer located on the first active layer and a second metal layer located on the first metal layer, and the first active layer comprises a silicon semiconductor material, and the second active layer comprises an oxide semiconductor material;

the driving array comprises a plurality of pixel driving circuits, and at least one of the pixel driving circuits comprises a first transistor and a second transistor; wherein the first active layer comprises an active pattern of the first transistor, the second active layer comprises an active pattern of the second transistor, and the first metal layer comprises a gate of the first transistor; and a shielding layer, comprising a first shielding portion located between the active pattern of the first transistor and the substrate, and the first shielding portion is electrically connected to a predetermined stable voltage through the second metal layer.

8. The display panel according to claim 7, wherein the pixel driving circuit further comprises:

a storage capacitor, comprising a first capacitor electrode and a second capacitor electrode, and the first metal layer comprises the first capacitor electrode electrically connected to the gate of the first transistor, and the second metal layer comprises the second capacitor electrode disposed opposite to the first capacitor electrode.

9. The display panel according to claim 8, wherein the first shielding portion is disposed opposite to the first capacitor electrode.

10. The display panel according to claim 7, wherein the second metal layer further comprises a first signal line electrically connected to the gate of the first transistor, and the first shielding portion is electrically connected to the first signal line.

11. The display panel according to claim 10, further comprising a light-emitting device electrically connected to one of a source and a drain of the first transistor, and the second metal layer further comprises a second signal line, and at least one of the pixel driving circuits further comprises a seventh transistor, and the second signal line is electrically connected to the light-emitting device through the seventh transistor, and the first signal line and the second signal line are spaced apart.

12. The display panel according to claim 11, wherein the second metal layer further comprises a bottom gate of the second transistor, and the second active layer is located on the second metal layer, and the active pattern of the second transistor is located above the bottom gate of the second transistor.

13. The display panel according to claim 12, wherein the second transistor is electrically connected between the gate of the first transistor and the first signal line; the shielding layer further comprises a second shielding line, and the second shielding line is located between the active pattern of the second transistor and the substrate, and the second shielding line is electrically connected to the first shielding portion.

14. The display panel according to claim 13, wherein at least one of the pixel driving circuits further comprises a third transistor electrically connected between the gate of the first transistor and one of the source and drain of the first transistor, and the second active layer comprises an active pattern of the third transistor;

the shielding layer further comprises a third shielding line, and the third shield line is located between the active pattern of the third transistor and the substrate, and is electrically connected to the first shielding portion and the second shielding line.

15. The display panel according to claim 14, wherein at least one of the pixel driving circuits further comprises: a fourth transistor and a fifth transistor electrically connected to one of the source and the drain of the first transistor, and a sixth transistor electrically connected between another of the source and drain of the first transistor and the light-emitting device;

the first active layer further comprises an active pattern of the fourth transistor, an active pattern of the fifth transistor, an active pattern of the sixth transistor and an active pattern of the seventh transistor;

the shielding layer further comprises a fourth shielding line between the active pattern of the fourth transistor and the substrate, a fifth shielding line located between the active pattern of the fifth transistor and the substrate, a sixth shielding line located between the active pattern of the sixth transistor and the substrate and a seventh shielding line located between the active pattern of the seventh transistor and the substrate.

16. The display panel according to claim 15, wherein the fourth shielding line, the fifth shielding line, the sixth shielding line, and the seventh shielding line are spaced apart or in contact with each other.

17. The display panel according to claim 15, wherein
the first metal layer further comprises a gate of the fourth transistor, a gate of the fifth transistor, a gate of the sixth transistor and a gate of the seventh transistor;
the driving array further comprises a third metal layer and a fourth metal layer on the third metal layer;
wherein the third metal layer comprises a top gate of the second transistor, a top gate of the third transistor, a third signal line electrically connected to the top gate of the second transistor and a fourth signal line electrically connected to the top gate of the third transistor, and the top gate of the second transistor is located above the active pattern of the second transistor, and the top gate of the third transistor is located above the active pattern of the third transistor; the fourth metal layer comprises a fifth signal line, and a source and a drain electrically connected to the first active layer and the second active layer, and the fifth signal line is electrically connected to one of the source and the drain of the first transistor through the fourth transistor.

18. The display panel according to claim 7, further comprising a barrier layer, a second substrate, a first buffer layer and a second buffer layer sequentially stacked in a direction from the substrate toward the driving array;
wherein the shielding layer is located between the substrate and the barrier layer, or located between the barrier layer and the second substrate, or located between the second substrate and the first buffer layer or located between the first buffer layer and the second buffer layer.

19. The display panel according to claim 7, wherein a thickness of the shielding layer is greater than or equal to 15 angstroms and less than or equal to 50 angstroms.

20. A display device, comprising the display panel according to claim 7.

* * * * *